United States Patent
Lee et al.

(10) Patent No.: US 7,256,495 B2
(45) Date of Patent: Aug. 14, 2007

(54) PACKAGE SUBSTRATE MANUFACTURED USING ELECTROLYTIC LEADLESS PLATING PROCESS, AND METHOD FOR MANUFACTURING THE SAME

(75) Inventors: Jong-Jin Lee, Daejeon (KR); Young-Hwan Shin, Daejeon (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/609,499

(22) Filed: Jul. 1, 2003

(65) Prior Publication Data

US 2004/0173375 A1 Sep. 9, 2004

(30) Foreign Application Priority Data

Feb. 24, 2003  (KR) ............... 10-2003-0011513

(51) Int. Cl.
*H01L 23/48* (2006.01)
(52) U.S. Cl. .................. 257/737; 174/255
(58) Field of Classification Search ........ 257/734–739, 257/700–707; 438/106–108; 174/255
See application file for complete search history.

(56) References Cited

U.S. PATENT DOCUMENTS

| | | | |
|---|---|---|---|
| 6,208,525 B1 * | 3/2001 | Imasu et al. ............... 361/783 |
| 6,249,045 B1 * | 6/2001 | Kresge et al. ............. 257/678 |
| 6,407,341 B1 * | 6/2002 | Anstrom et al. ........... 174/255 |
| 6,507,497 B2 * | 1/2003 | Mashino .................... 361/767 |
| 6,649,506 B2 * | 11/2003 | Hsu ........................... 438/612 |
| 6,762,921 B1 * | 7/2004 | Asai et al. ................. 361/111 |
| 2003/0011070 A1 * | 1/2003 | Iijima et al. ............... 257/734 |
| 2004/0048414 A1 * | 3/2004 | Heinz et al. ............... 438/106 |
| 2004/0099939 A1 * | 5/2004 | Alcoe et al. ............... 257/687 |
| 2004/0154166 A1 * | 8/2004 | Lee et al. ................... 29/852 |
| 2004/0201095 A1 | 10/2004 | Palmer et al. |
| 2005/0067713 A1 | 3/2005 | Mutta et al. |
| 2005/0218503 A1 | 10/2005 | Abe et al. |
| 2006/0023439 A1 | 2/2006 | Fraley et al. |

FOREIGN PATENT DOCUMENTS

| | | |
|---|---|---|
| JP | 05-347468 | 12/1993 |
| JP | 07-193166 | 7/1995 |
| JP | 10-321750 | 12/1998 |

* cited by examiner

*Primary Examiner*—Nathan W. Ha
(74) *Attorney, Agent, or Firm*—Morgan, Lewis & Bockius LLP

(57) ABSTRACT

A package substrate is manufactured by electrolytically plating Au in a semi-additive manner without using any plating lead line. Such a package substrate includes a base substrate with a plurality of through holes, a first copper plated layer on portions of the base substrate and inner surfaces of the through holes, a plated pattern layer on the first copper plated layer, wire bonding pads on the plated pattern layer at an upper surface of the base substrate, the wire bonding pads including Au and not connected to a remnant of a plating lead line, solder ball pads on the plated pattern layer at a lower surface of the base substrate, the solder ball pads including Au and not connected to a remnant of a plating lead line, and a solder resist covering the base substrate and the plated pattern layer.

8 Claims, 18 Drawing Sheets

PACKAGE SUBSTRATE MANUFACTURED USING ELECTROLYTIC LEADLESS PLATING PROCESS, AND METHOD FOR MANUFACTURING THE SAME

BACKGROUND OF THE INVENTION

1. Field of the Invention

The present invention relates to a package substrate manufactured using an electrolytic leadless plating process, and a method for manufacturing the same. More particularly, the present invention relates to a package substrate of, for example, a ball grid array (BGA) type or a chip scale package (CSP) type, manufactured by electrolytically plating Au in a semi-additive manner without using any plating lead line on wire bonding pads to be connected with a semiconductor chip mounted on a base substrate, and solder ball pads, and a method for manufacturing the same.

2. Description of the Related Art

In spite of the recent tendency of integrated circuits to have a light, thin, simple and miniature structure, integrated circuit packages rather tend to have an increased number of leads extending outwardly therefrom. One method capable of solving problems caused by installation of a number of leads on a carrier for a miniature package is to use a carrier having a pin grid array (PGA). Although such a PGA carrier can have a number of leads while having a miniature size, it has a drawback in that its pins or leads may be easily broken due to their low strength, or involves a limitation of high-density integration.

In order to solve such drawbacks involved with PGA, use of BGA package substrates has recently been generalized. The reason why such a BGA package substrate has been generally used is that it is possible to easily achieve a high-density integration of the substrate in accordance with use of solder balls finer than pins. Such a BGA package substrate is mainly used for a package substrate adapted to mount a semiconductor chip thereon.

A conventional example of such a BGA package will be described in brief hereinafter. Referring to FIG. 1, a conventional BGA package is shown which has a structure formed with solder balls 8, in place of conventional pins. In order to fabricate this structure, a plurality of copper clad laminates (CCLs) 4 are first prepared. An inner-layer circuit is formed at each of the CCLs 4 in accordance with a well-known photolithography process. The CCLs 4 are then laminated in accordance with a pressing process. Thereafter, via holes 2 are formed at the laminated CCL structure in order to electrically connect the inner-layer circuits of respective CCLs. The via holes 2 are plated with a copper film 3 so that they are electrically connected. An outer-layer circuit 6 is subsequently formed at the outermost CCL 4 of the laminated CCL structure in accordance with a photolithography process. The outer-layer circuit 6 has bond fingers 1 to be connected with a semiconductor chip mounted on the laminated CCL structure. Thereafter, solder ball pads 7, a solder mask 5, and solder balls 8 are sequentially formed at a surface of the laminated CCL structure opposite to the outer-layer circuit 6.

Meanwhile, Au-plating lead lines are formed in order to perform a plating process adapted to obtain improved electrical connections of the pads 7 with both the bond fingers 1 connected to the semiconductor chip and the solder balls 8. Each Au-plating lead line is connected to an associated one of the pads 7 connected to respective solder balls 8. Although not shown, the Au-plating lead lines are also connected to the bond fingers 1 via the pads 7 and via holes 2, respectively. FIG. 2 is a plan view illustrating the package substrate plated using conventional plating lead lines. As shown in FIG. 2, plating lead lines 9 are connected to respective solder ball pads 7 at which respective solder balls 8 are formed. The area where the plating lead lines 9 are formed corresponds to the portion A of FIG. 1. Substantially, there is a limitation of high-density integration in designing a circuit, due to such plating lead lines.

On the other hand, an integrated circuit (IC) chip is mounted on the CCL 4 formed with the outer-layer circuit 6, while being connected with the outer-layer circuit 6 by conductive lines. An encapsulant is coated over the CCL 4 to protect the CCL 4 from the surroundings. Thus, the BGA package substrate 10 is connected with a main circuit board by the solder balls 8 formed at the pads 7 of the pad-carried CCL 4, as compared to a PGA substrate which is connected to a main circuit board by pins. For this reason, it is possible to easily miniaturize BGAs, as compared to PGAs. Accordingly, the BGA substrate 10 can achieve high-density integration.

However, the above mentioned conventional BGA package substrate 10 involves a problem in that it is difficult to achieve high-density integration of the Au-plating lead lines adapted to carry out an Au plating process for the bond fingers 1 and pads 7 because the pitch of the solder balls 8 in the BGA package substrate, that is, the space between adjacent solder balls, is rendered to be very small due to high-density integration of circuits and miniaturization of devices using such circuits, and because of high-density integration of circuits arranged around the bond fingers 1 of the outer-layer circuit mounted with the semiconductor chip thereon.

Now, a conventional method for manufacturing a package substrate plated with Au using plating lead lines will be described with reference to FIGS. 3*a* to 3*i*.

First, a plurality of through holes, that is, via holes, 12, are formed at a base substrate 11 (FIG. 3*a*). A copper film 13 is plated in accordance with an electroless plating process to cover the entire surface of the base substrate 11 and the inner surface of each through hole 12 (FIG. 3*b*).

In order to manufacture a package substrate provided with desired circuits, a resist 14 for a copper plating process is then coated over the plated upper and lower surfaces of the base substrate 11. The resist 14 is subsequently subjected to exposure and development processes so that it is patterned in such a fashion that it is removed from portions of the copper-plated surfaces of the base substrate 11 respectively corresponding to regions where desired circuit patterns are to be plated (FIG. 3*c*). The via holes 12 are formed by perforating through holes into the base substrate 11 using a mechanical drill. For the resist 14, a dry film is typically used.

Thereafter, circuit patterns 15 are formed, in accordance with a plating process, on the copper-plated surface portions of the base substrate 11 corresponding to respective regions where the resist 14 is not present (FIG. 3*d*). The remaining resist 14 is then completely removed using a stripping solution (FIG. 3*e*).

Subsequently, portions of the copper film 13 exposed on the base substrate in accordance the removal of the resist 14 are removed using an etchant (FIG. 3*f*). In FIG. 3*f*, the reference numeral 16 denotes regions where the copper film 13 is etched by the etchant.

A solder resist 17 is then coated over the entire surface of the resultant structure, and subjected to exposure and development processes so that it is removed from regions where Au is to be plated in accordance with an electrolytic plating process, that is, wire bonding pads and solder ball pads are to be formed (FIG. 3g).

An Au film 18 is plated on wire bonding pads and solder ball pads included in respective circuits by applying current to the previously formed plating lead lines. The plating of the Au film 18 may be achieved in accordance with an electrolytic Ni—Au plating process. Typically, the thickness of the plated Au film 18 is about 0.5 to 1.0 µm (FIG. 3h).

Generally, an electrolytic Au plating process is mainly used for metal finishing of the surface of a package substrate on which a semiconductor chip is mounted, because it is superior over an electroless Au plating process in terms of reliability. For such an electrolytic Au plating process, however, it is necessary to design the package substrate to be provided with plating lead lines. For this reason, there is a reduction in line density. Such a reduced line density causes a problem in manufacturing a circuit having a high-density integration.

Thereafter, the plating lead lines are cut using a router or a dicing process (FIG. 3i). In FIG. 3i, the reference numeral 19 denotes a region where the dicing process is carried out. That is, the plating lead lines are cut using the router or dicing process, after completion of the electrolytic Au plating process. However, the plating lead lines are incompletely removed from the package substrate. The residues of the plating lead lines may cause noise during transmission of electrical signals in the circuits provided at the package substrate. As a result, there is a degradation in electrical performance.

Meanwhile, recently, manufacturers of package substrates have made an effort to develop a technique capable of carrying out an electrolytic Au plating process without using any plating lead line. In the above mentioned conventional electrolytic Au plating process, both the wire bonding pads and the solder ball pads are plated with Au to the same thickness (in most cases, 0.5 to 1.5 µm). In the case of the solder ball pads, however, such a thickness is excessive, as compared to an appropriate thickness of 0.03 to 0.25 µm. For this reason, there is a problem associated with the reliability of the bonding of solder bails.

SUMMARY OF THE INVENTION

The present invention has been made in view of the above mentioned problems, and an object of the invention is to provide a package substrate manufactured in a semi-additive manner without using any plating lead line, thereby being capable of achieving an improvement in line density, and a method for manufacturing the package substrate.

Another object of the invention is to provide a package substrate capable of completely removing all plating lead lines used in a normal electrolytic Au plating process, thereby achieving suppression of noise.

In accordance with one aspect, the present invention provides a method for manufacturing a package substrate without using any plating lead line, comprising the steps of: a) plating copper on all surfaces of a base substrate formed with a plurality of through holes and inner surfaces of the through holes, thereby forming a first copper plated layer; b) coating a first resist for a plating process over the first copper plated layer, partially removing the first resist, thereby exposing predetermined portions of the first copper plated layer respectively corresponding to regions where circuit patterns are to be plated; c) plating copper on the exposed portions of the first copper plated layer, thereby forming a second copper plated layer; d) stripping the first resist remaining on the first copper plated layer; e) coating a second resist for a plating process over all surfaces of a structure obtained after completion of the step (d), and removing the second resist from regions where wire bonding pads and solder ball pads are to be formed; f) removing portions of the first copper plated layer exposed without being covered by the second resist, by use of an etchant; g) forming an Au layer on portions of the second copper plated layer exposed without being covered by the second resist in accordance with an electrolytic Ni—Au plating process, thereby forming the wire bonding pads and the solder ball pads; h) removing the second resist remaining on the structure by use of a stripping solution; i) removing portions of the first copper-plated layer exposed in accordance with the removal of the second resist, by use of an etchant; and j) coating a solder resist over all surfaces of a structure obtained after completion of the step (i), and removing portions of the solder resist respectively covering the wire bonding pads and the solder ball pads.

The first copper plated layer is formed in accordance with an electroless copper plating process. The first copper plated layer serves as a plating lead line during the electrolytic Au plating processes for the solder ball pads and the wire bonding pads.

The second copper plated layer is an electrolytic copper plated layer, and forms the circuit patterns. Preferably, the second resist is a dry film for an Au plating process.

Preferably, the Au layer plated in accordance with the electrolytic Au—Ni plating process has a thickness of 0.5 to 1.5 µm.

In accordance with another aspect, the present invention provides a package substrate electrolytically plated with Au without using any plating lead line, comprising: a base substrate formed with a plurality of through holes; a first copper plated layer plated on predetermined portions of the base substrate and inner surfaces of the through holes; a plated pattern layer formed on the first copper plated layer; wire bonding pads formed on predetermined portions of the plated pattern layer at an upper surface of the base substrate in accordance with an electrolytic Au plating process without using any plating lead line; solder ball pads formed on predetermined portions of the plated pattern layer at a lower surface of the base substrate in accordance with an electrolytic Au plating process without using any plating lead line; and a solder resist covering the base substrate and the plated pattern layer, except for the wire bonding pads and the solder ball pads, the plated pattern layer being formed by coating a resist on the first copper plated layer, except for regions around the through holes, and forming a second copper plated layer in a semi-additive manner on portions of the first copper plated layer at which the resist is not present.

Preferably, the wire bonding pads and the solder ball pads are Au layers plated in accordance with application of current to the first copper plated layer.

Preferably, the first copper plated layer serves as a plating lead line during the electrolytic Au plating processes for the solder ball pads and the wire bonding pads.

Preferably, each of the electrolytic Au plating process forms a plated layer having a thickness of 0.5 to 1.5 µm.

In accordance with the present invention, it is possible to manufacture a package substrate without using any plating lead line because an Au layer is plated on wire bonding pads and solder ball pads in a semi-additive manner without using any plating lead line in accordance with an electrolytic Au plating process. Accordingly, it is possible to achieve an improvement in the line density of the package substrate, while avoiding generation of noise by virtue of elimination of plating lead lines.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, a package substrate manufactured using an electrolytic leadless plating process without using any plating lead line and a method for manufacturing the same in accordance with each embodiment of the present invention will be described in detail.

FIGS. 6a to 6k are views illustrating processes for manufacturing a package substrate in a semi-additive manner without using any plating lead line in accordance with an embodiment of the present invention, respectively. The package substrate and its manufacturing method will be described in conjunction with FIGS. 6a to 6k.

Figure 6A:
FIGS. 6a to 6k are views respectively illustrating processes for manufacturing a package substrate without using any plating lead line in accordance with a first embodiment of the present invention.
Figure 6B:

First, a plurality of through holes, that is, via holes, 32, are formed at a base substrate 31 (FIG. 6a). A first copper plated layer 33 is formed to cover the entire surface of the base substrate 31 and the inner surface of each through hole 32 (FIG. 6b). The plating of the first copper plated layer 33 is carried out in accordance with an electroless plating process. The first copper plated layer 33 serves as a plating lead line for plating Au on wire bonding pads and solder ball pads.

Although the base substrate according to the present invention is illustrated as consisting of a single-layer CCL structure, it may consist of a multi-layer CCL structure including a plurality of laminated CCLs. The CCL may include an epoxy substrate, and copper foils respectively bonded to upper and lower surfaces of the epoxy substrate by a conductive adhesive. The base substrate 31 is formed with an inner-layer circuit having a ground pattern or signal processing pattern in accordance with a photolithography process. The through holes, that is, via holes, 32, serve to electrically connect circuits respectively provided at upper and lower surfaces of the base substrate 31. In order to electrically connect the circuits, a copper plated film, that is, the first copper plated layer 33, is formed at the base substrate 31 in accordance with a copper plating process. In the illustrated case, the first copper plated layer 33 covers the entire surface of the base substrate 31 and the inner surface of each through hole 32.

Figure 6C:
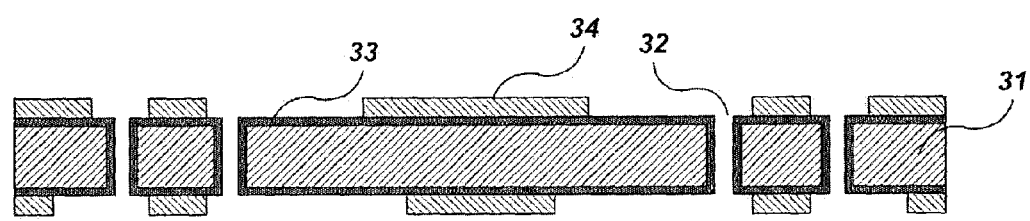
Figure 6D:
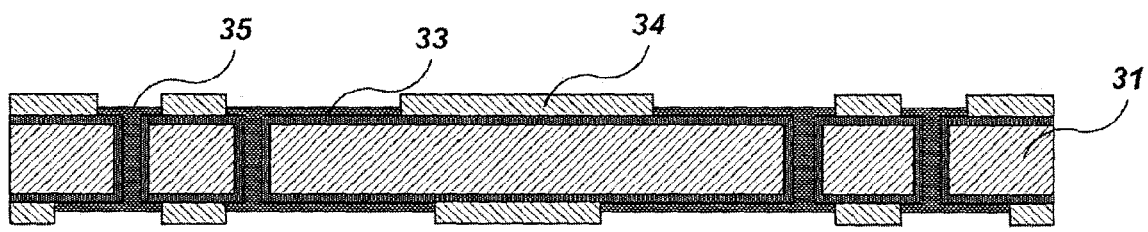

A first resist 34 for a copper plating process is then coated over portions of the first plated layer 33 covering the upper and lower surfaces of the base substrate 31. The resist 34 is subsequently removed from regions where desired circuit patterns are to be plated, thereby partially exposing the first copper plated layer 33 (FIG. 6c).

Thereafter, copper is plated on the exposed portions of the first copper plated layer 33, thereby forming a second copper plated layer 35 (FIG. 6d) This second copper plated layer 35 is formed in accordance with an electrolytic copper plating process, and forms circuit patterns.

Figure 6E:
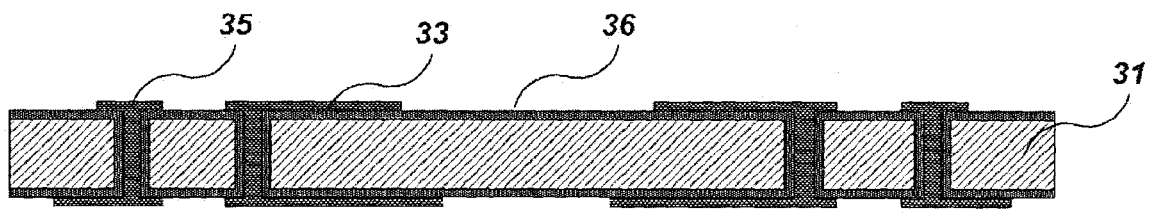
Figure 6F:
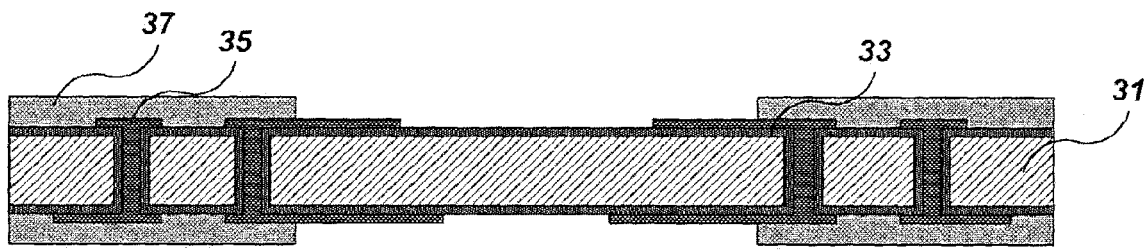

The remaining first resist 34 is then completely removed using a stripping solution (FIG. 6e). Over the resultant structure, a second resist 37 for a plating process is coated, and then removed from regions where wire bonding pads and solder ball pads are to be formed, thereby partially exposing the second copper plated layer 35 (FIG. 6f). Preferably, the second resist 37 is a dry film for an Au plating process.

Figure 6G:
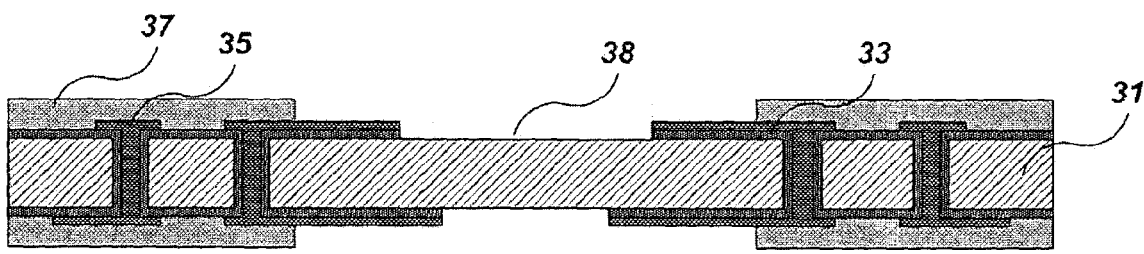
Figure 6H:
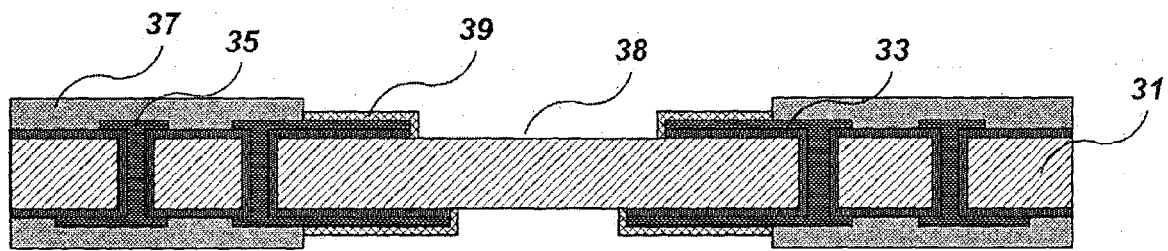

Subsequently, portions of the first copper plated layer 33 exposed in accordance the removal of the second resist 37 are removed using an etchant (FIG. 6g). In FIG. 6g, the reference numeral 38 denotes a region where the base substrate 31 is exposed in accordance with the removal of the first copper plated layer 33. An Au layer 39 is then plated on the exposed portions of the second copper plated layer 35 corresponding to respective regions where wire bonding pads and solder ball pads are to be formed, in accordance with an electrolytic Ni—Au plating process. Preferably, the Au layer 39 has a thickness of 0.5 to 1.5 μm. In this plating process, current flows through the first copper plated layer 33. The Au layer 39 forms wire bonding pads and solder ball pads.

Figure 6I:
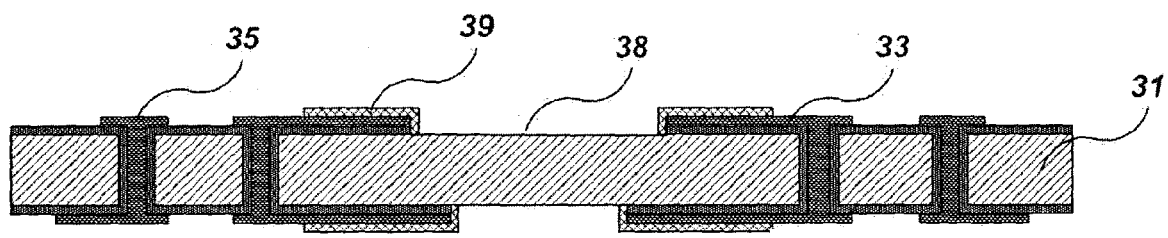
Figure 6J:
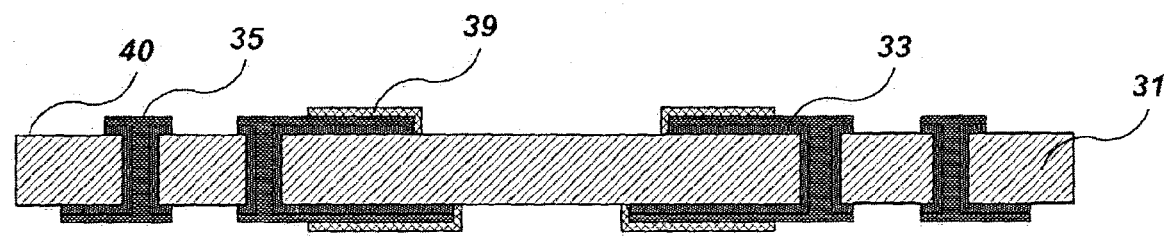
Figure 6K:
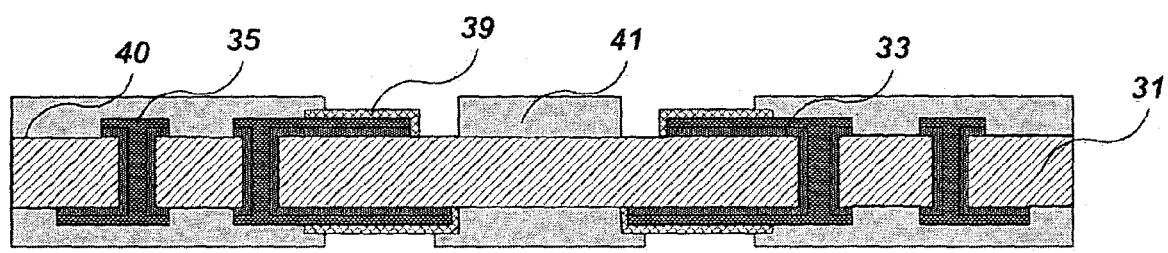

Thereafter, the remaining second resist 37 is completely removed using a stripping solution (FIG. 6i). Portions of the first copper plated layer 33 exposed in accordance with the removal of the second resist 37 are then removed using an etchant (FIG. 6j). In FIG. 6j, the reference numeral 40 denotes regions where the first copper plated layer 33 is removed.

Finally, a solder resist 41 is coated over the entire surface of the resultant structure, and then removed from regions where the Au layer 39, that is, the wire bonding pads and solder ball pads, have been formed (FIG. 6k) That is, the solder resist 41 is subjected to exposure and development processes so that its portions covering the wire bonding pads and solder ball pads are removed.

Thus, the package substrate electrolytically plated with Au without using any plating lead line in accordance with present invention includes: a) the base substrate 31 formed with a plurality of through holes 32; b) the first copper plated layer 33 plated on predetermined portions of the base substrate 31 and the inner surface of each through hole 32; c) the second copper plated layer 35 formed on the first copper plated layer 33 to form circuit patterns; d) the wire bonding pads formed on predetermined portions of the second copper plated layer 35 at the upper surface of the base substrate 31 in accordance with an electrolytic Au plating process without using any plating lead line; e) solder ball pads 39 formed on predetermined portions of the second copper plated layer 35 at the lower surface of the base substrate 31 in accordance with an electrolytic Au plating process without using any plating lead line; and f) a solder resist 41 covering the base substrate 31 and second copper plated layer 35, except for the wire bonding pads and solder ball pads.

In accordance with the present invention, the resist 34 for a plating process is coated on the first copper plated layer 33, except for regions around the through holes 32, and the second copper plated layer 35 (pattern plated layer) is formed in a semi-additive manner on the first copper plated layer 33 at regions where the resist 34 is not present. The semi-additive plating process will be described hereinafter.

Figure 1:
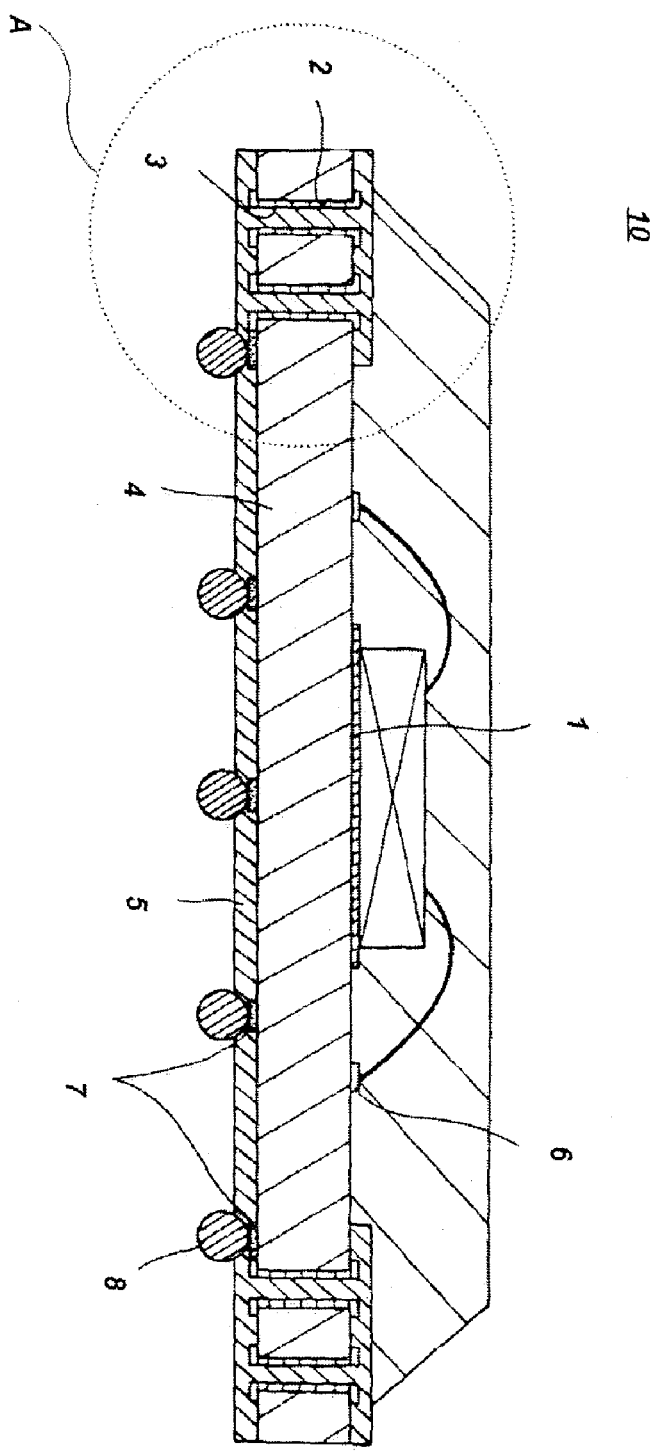
FIG. 1 is a sectional view illustrating a conventional BGA package.
Figure 2:
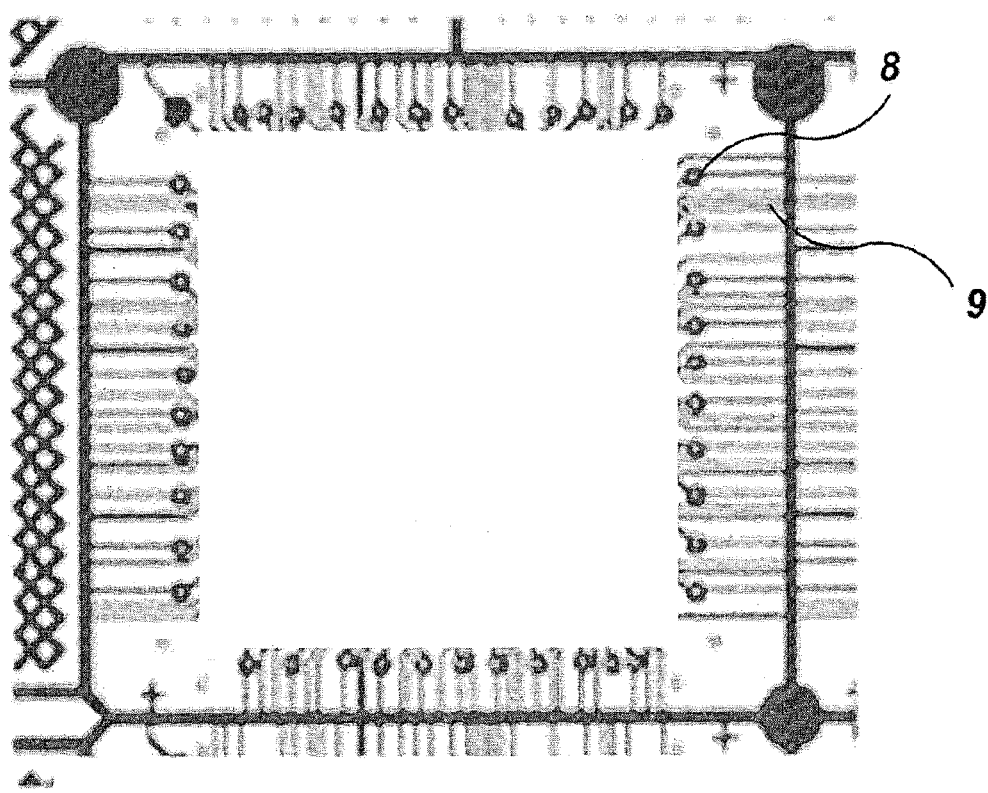
FIG. 2 is a plan view illustrating the package substrate plated using conventional plating lead lines.
Figure 3A:
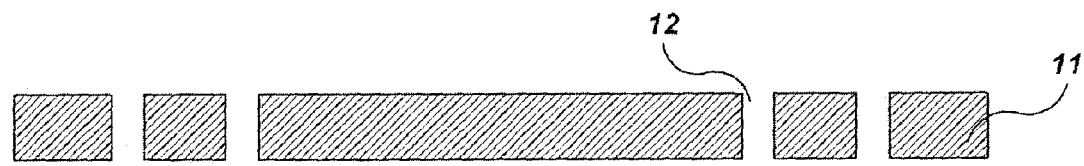
FIGS. 3a to 3i are views respectively illustrating a conventional method for manufacturing a package substrate plated with Au using plating lead lines.
Figure 3B:
Figure 3C:
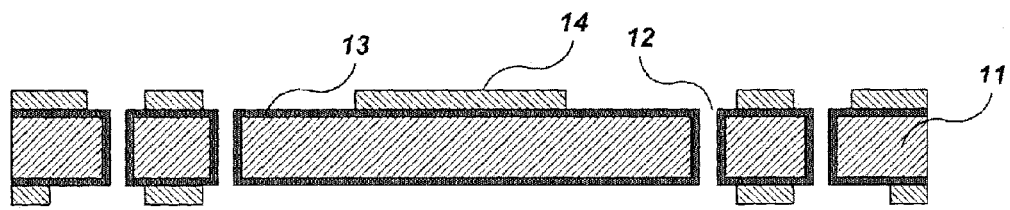
Figure 3C:
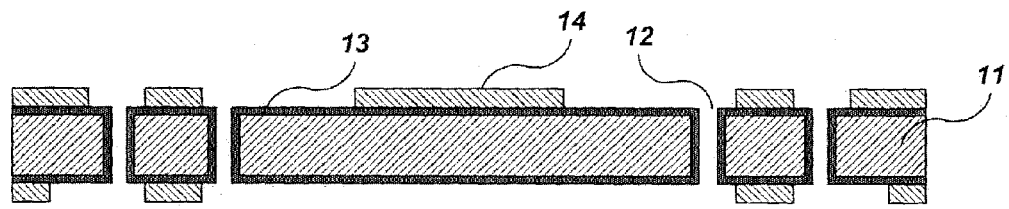
Figure 3D:
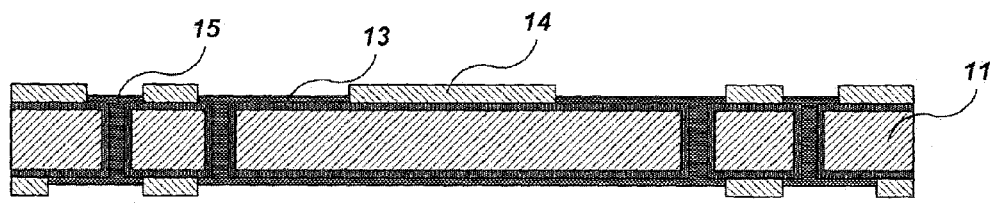
Figure 3E:
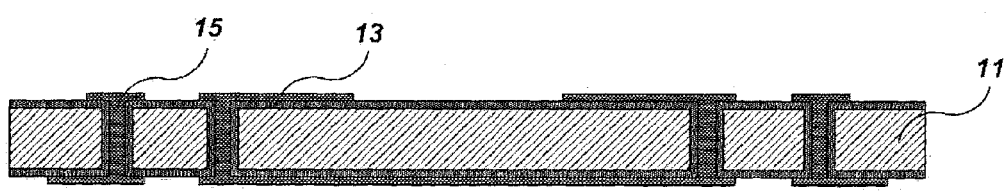
Figure 3F:
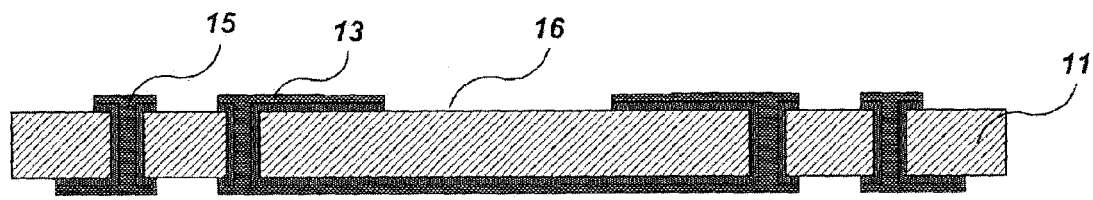
Figure 3G:
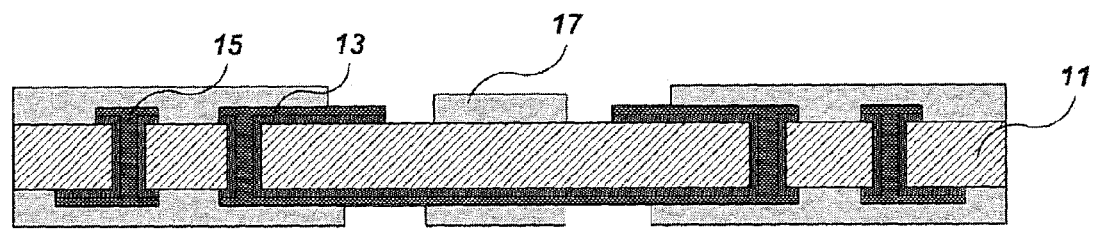
Figure 3H:
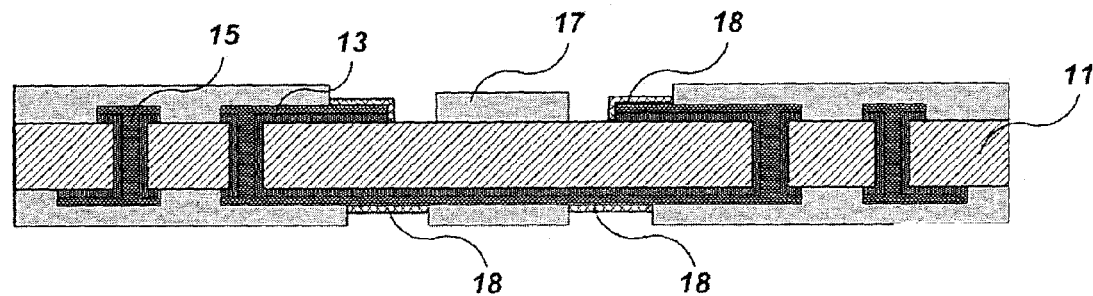
Figure 3I:
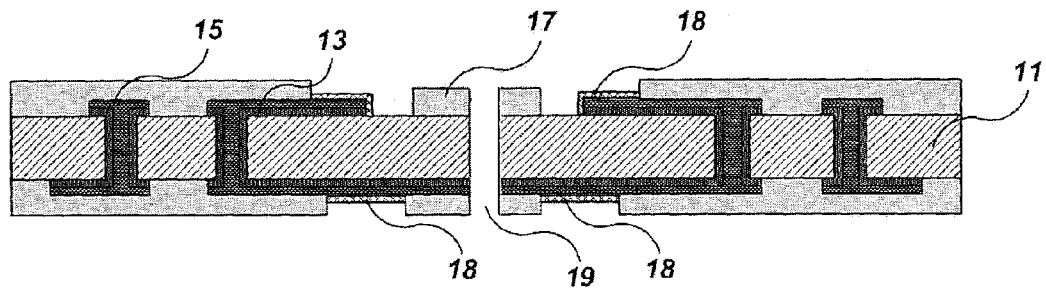
Figure 4:
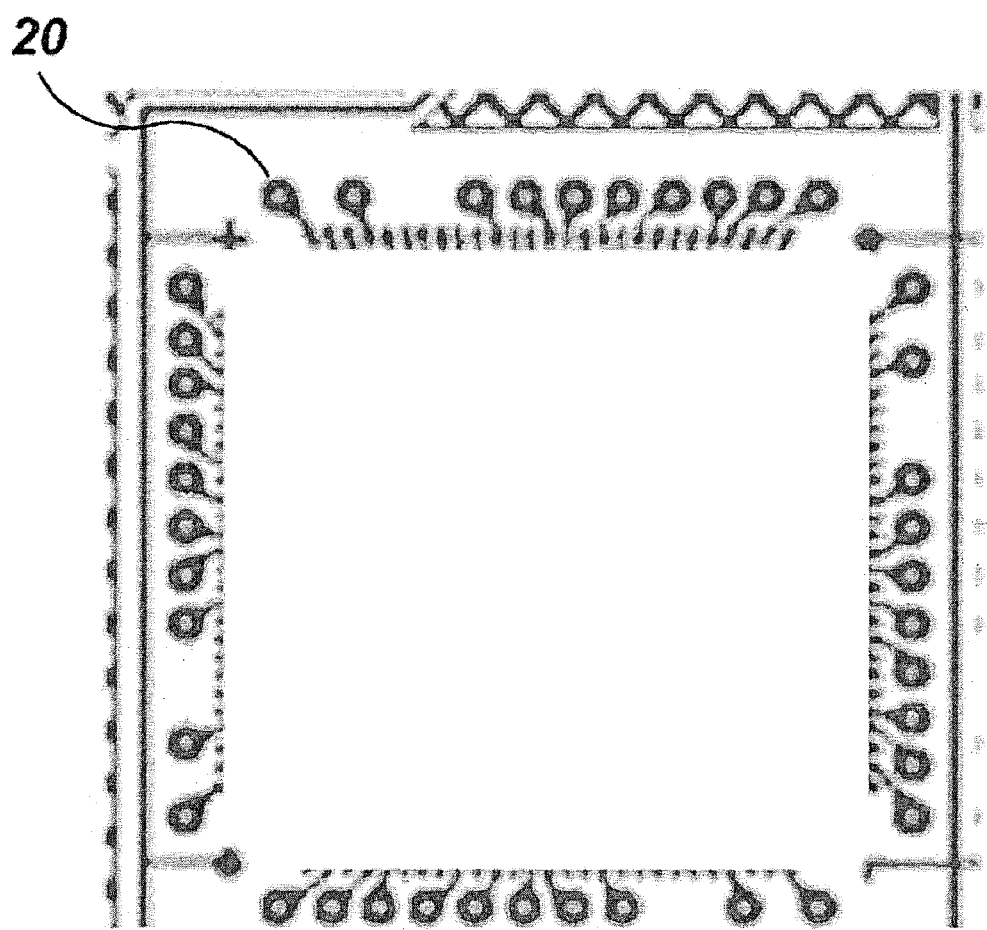
FIG. 4 is a plan view illustrating a package substrate manufactured without using any plating lead line in accordance with the present invention.

On the other hand, FIG. 4 is a plan view illustrating a package substrate manufactured without using any plating lead line in accordance with the present invention. Referring to FIG. 4, it can be seen that the package substrate according to the present invention is different from the conventional package substrate of FIG. 2 in that it does not use any plating lead lines adapted to be connected to solder ball pads 20.

Figure 5:
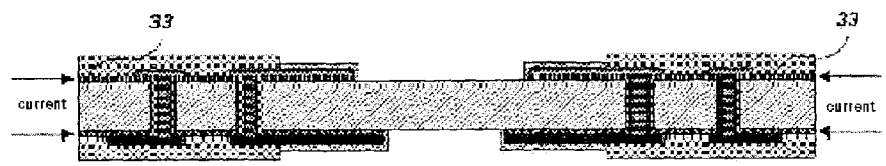
FIG. 5 is a sectional view illustrating application of current to the package substrate manufactured with using any plating lead line in accordance with the present invention.

FIG. 5 is a sectional view illustrating application of current to the package substrate manufactured with using any plating lead line in accordance with the present invention. Referring to FIG. 5, the wire bonding pads and solder ball pads are plated with Au as current flows through the copper plated layer 33, as described above.

Now, Au plating processes respectively using a conventional subtractive method and a semi-additive method according to the present invention will be described with reference to FIGS. 7 to 10.

FIGS. 7a to 7f are sectional views respectively illustrating processes for manufacturing a printed circuit board in a conventional subtractive manner. FIGS. 8a and 8b are sectional views respectively illustrating etching profiles of the printed circuit board manufactured in the conventional subtractive manner.

Figure 7A:
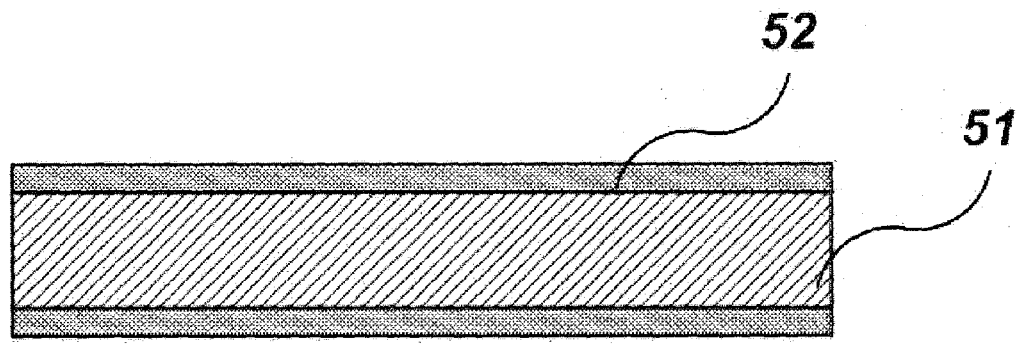
FIGS. 7a to 7f are sectional views respectively illustrating processes for manufacturing a printed circuit board in a conventional subtractive manner.
Figure 7B:
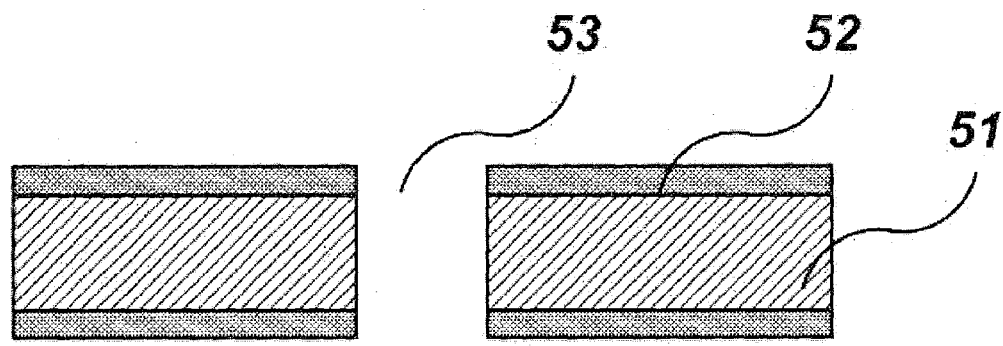
Figure 8A:
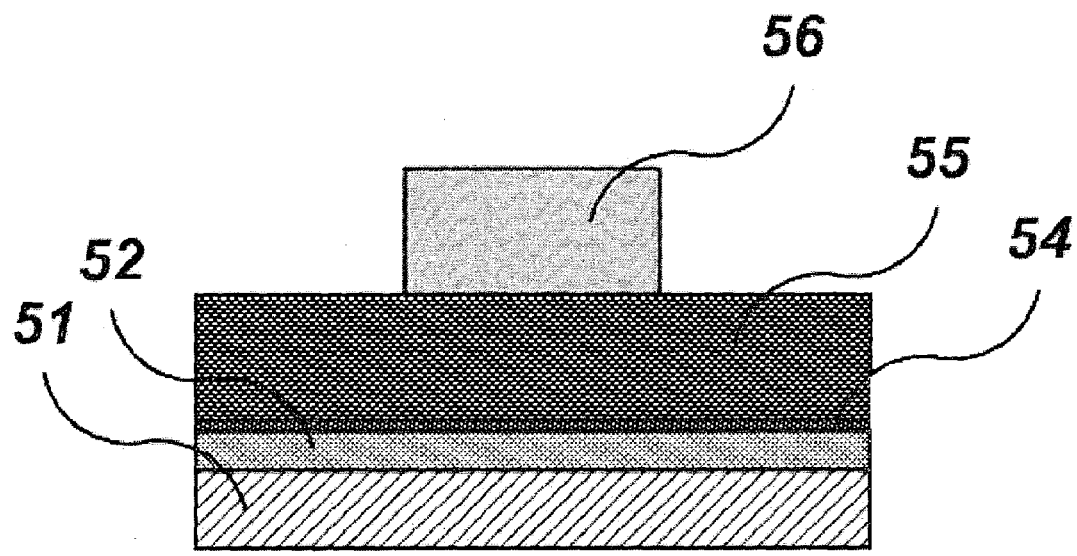
FIGS. 8a and 8b are sectional views respectively illustrating etching profiles of the printed circuit board manufactured in the conventional subtractive manner.
Figure 8B:
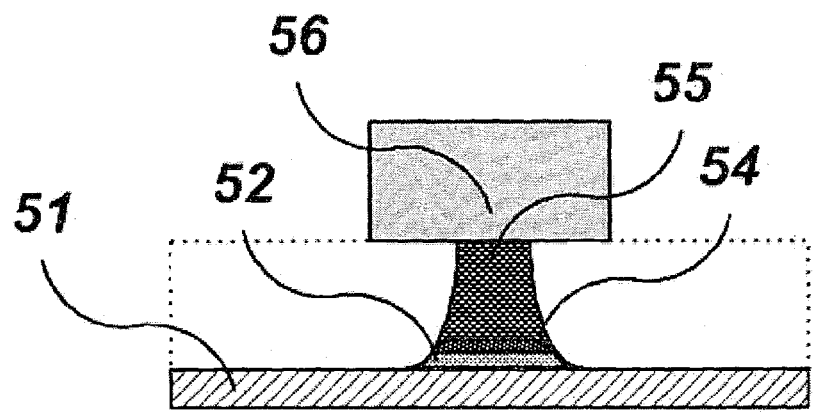

In order to manufacture a printed circuit board in a conventional subtractive manner, a base substrate is first prepared which includes a base substrate core 51, and copper foils 52 of about 12 μm formed at opposite surfaces of the base substrate core 51 (FIG. 7a). A plurality of through holes 53 are formed at the base substrate, using a mechanical drill (FIG. 7b). In this case, an etching process may be carried out to reduce the thickness of each copper foil 52 from about 12 μm to a thickness of 3 to 7 μm.

Figure 7C:
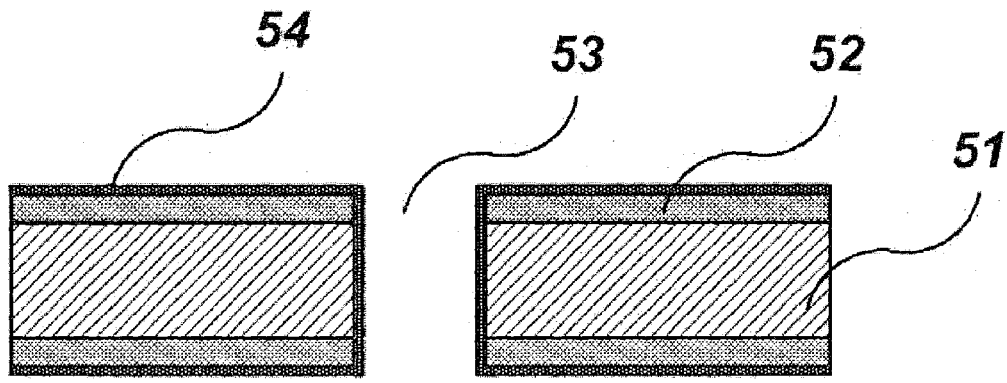
Figure 7D:
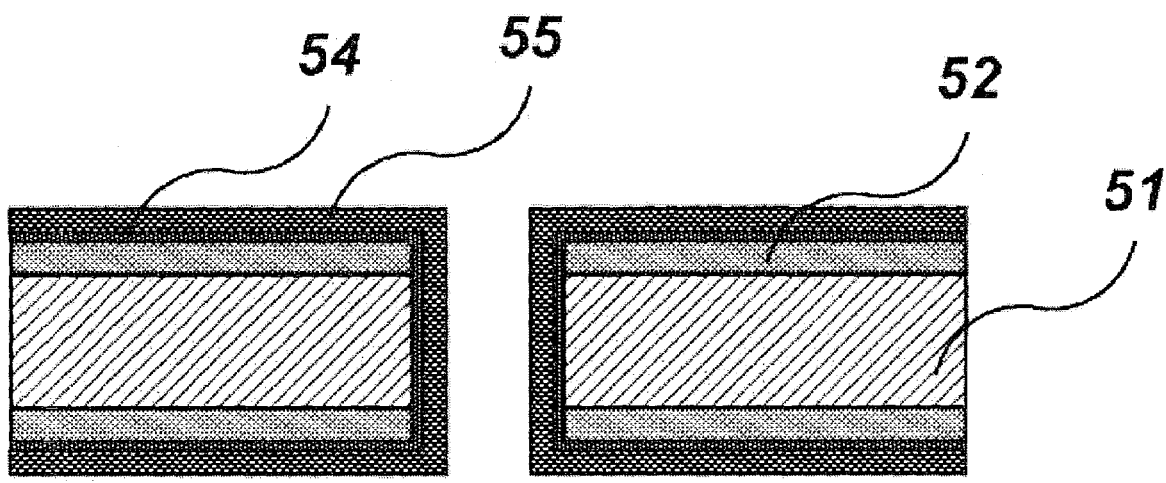

Thereafter, an electroless copper layer 54 having a thickness of about 0.5 μm is formed on the entire surface of the base substrate and the inner surface of each through hole 53 (FIG. 7c). Also, an electrolytic copper plated layer 55 having a thickness of about 15 μm is formed on the electroless copper layer 54 in accordance with an electrolytic plating process (FIG. 7d).

Figure 7E:
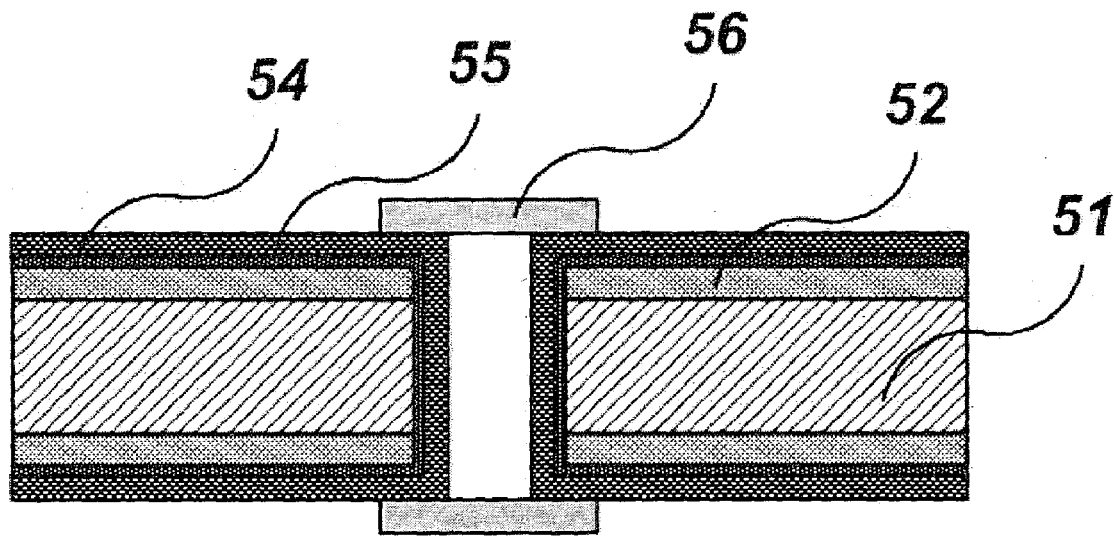
Figure 7F:
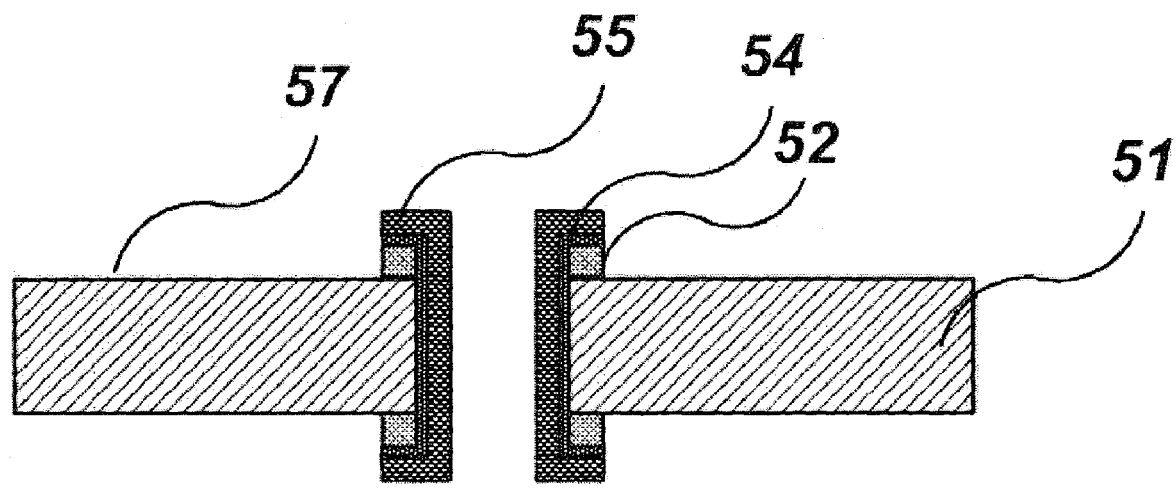

Dry films 56 having a thickness of about 15 μm are then laminated to tent upper and lower ends of each through hole 53 (FIG. 7e). The resultant structure is subsequently subjected to exposure and development processes, and the electroless copper plated layer 54 and electrolytic copper plated layer 55 are then removed, except for their portions corresponding to respective regions where the dry films are laminated, using an etchant (FIG. 7f).

FIGS. 8a and 8b show cross sections of the printed circuit board manufactured in accordance with the processes of FIGS. 7a to 7f, respectively. FIG. 8a shows a laminated structure including the base substrate core 51, the copper foil 52 of about 5 μm, the electroless copper plated layer 54 of about 0.5 μm, the electrolytic copper plated layer 55 of 15 μm, and the dry film 56 of about 15 μm. FIG. 8b shows a structure obtained after etching the side walls of the laminated structure shown in FIG. 8a. Referring to FIG. 8b, it can be seen that it is difficult to form micro circuits because the side walls are deeply etched.

On the other hand, FIGS. 9a to 9f are sectional views respectively illustrating processes for manufacturing a printed circuit board in a semi-additive manner in accordance with the present invention. FIGS. 10a and 10b are sectional views respectively illustrating etching profiles of the printed circuit board manufactured in the semi-additive manner in accordance with the present invention.

Figure 9A:
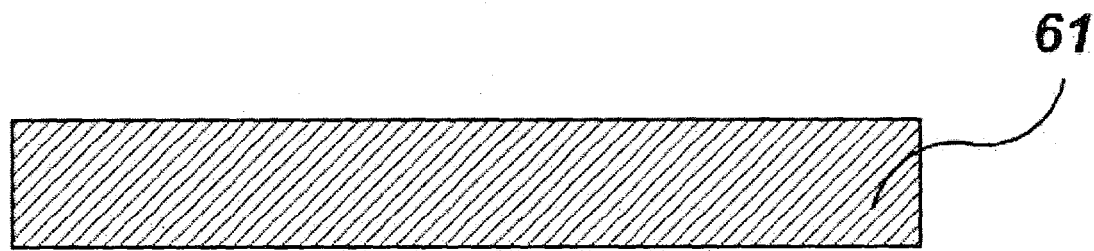
FIGS. 9a to 9f are sectional views respectively illustrating processes for manufacturing a printed circuit board in a semi-additive manner in accordance with the present invention.
Figure 9B:
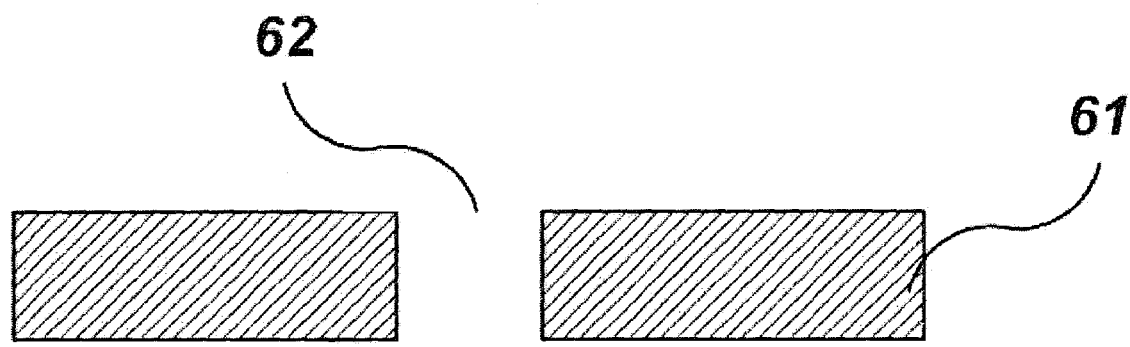
Figure 10A:
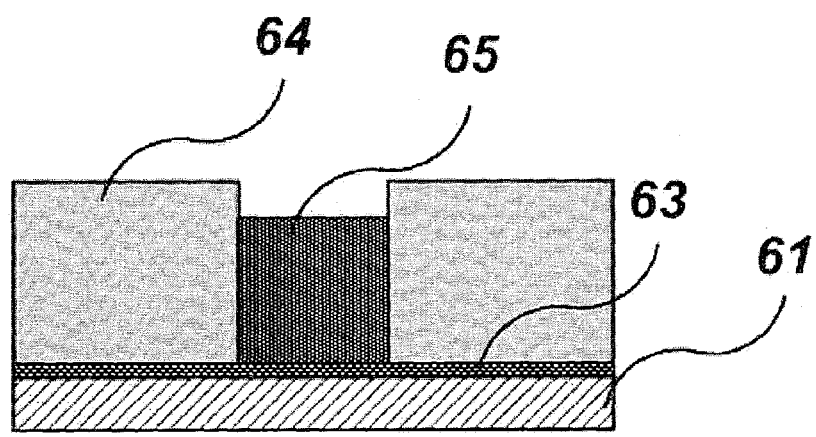
FIGS. 10a and 10b are sectional views respectively illustrating etching profiles of the printed circuit board manufactured in the semi-additive manner in accordance with the present invention.
Figure 10B:
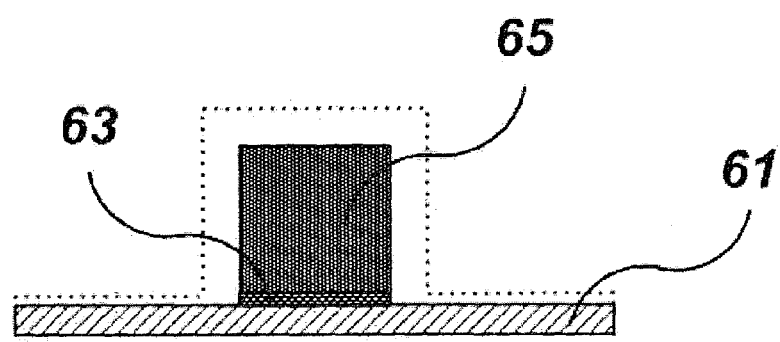

In order to manufacture a printed circuit board in a semi-additive manner in accordance with the present invention, a base substrate is first prepared which includes a base substrate core 61 (FIG. 9a). A plurality of through holes 62 are formed at the base substrate, using a mechanical drill (FIG. 9b).

Figure 9C:
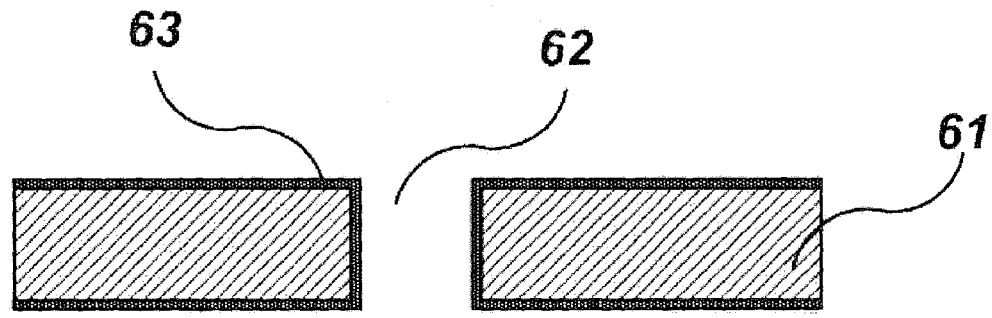
Figure 9D:
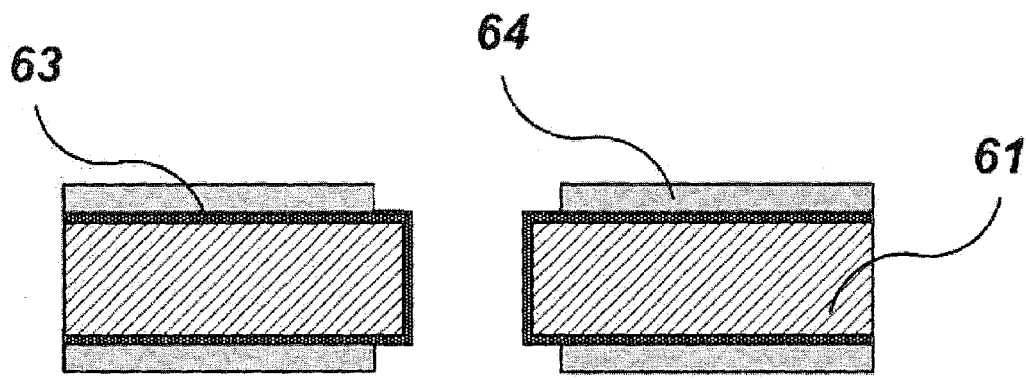
Figure 9E:
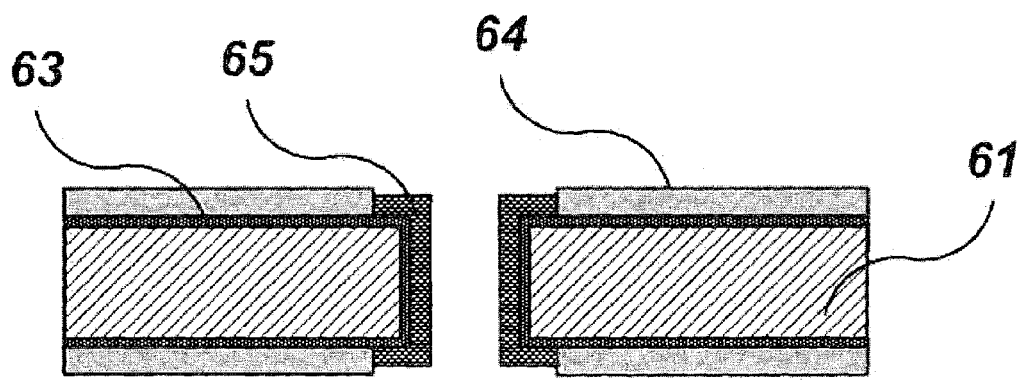
Figure 9F:
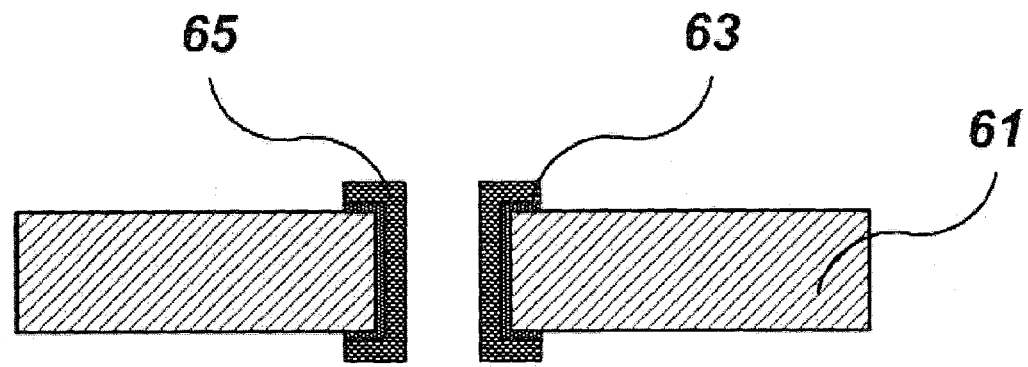

Thereafter, an electroless copper layer 63 having a thickness of about 0.5 μm is formed on the entire surface of the base substrate and the inner surface of each through hole 62 (FIG. 9c). Subsequently, dry films 64 are laminated on the electroless copper layer 63, except for regions around the through holes 62, and then subjected to exposure and development processes (FIG. 9d). An electrolytic copper layer 65 having a thickness of 15 to 20 μm is then formed on the electroless copper layer 63, except for regions where the dry films 64 are laminated (FIG. 9e) The resultant structure is subjected to exposure and development processes, the dry films (64) are stripped using a stripping solution, and then the electroless copper layer 63 is etched in accordance with a flash etching process (FIG. 9f).

In the printed circuit board manufactured in the subtractive manner of FIGS. 7a to 7f, the etching process is carried out after forming the electrolytic copper plated layer 55 on the electroless copper plated layer 54, and then. laminating the dry films 56. In the printed circuit board manufactured in the semi-additive manner of FIGS. 9a to 9f, however, the flash etching process is carried out after laminating the dry films 64 on the electroless copper plated layer 63, and then forming the electrolytic copper plated layer 65.

FIGS. 10a and 10b show cross sections of the printed circuit board manufactured in accordance with the processes of FIGS. 9a to 9f, respectively. FIG. 10a shows a laminated structure including the base substrate core 61, the electroless copper plated layer 63 of about 0.5 μm, the dry films 64 of about 25 μm, and the electrolytic copper plated layer 65 of 20 μm laminated between the dry films 64. FIG. 10b shows a structure obtained after carrying out a stripping and flash etching process for the laminated structure shown in FIG. 10a. Referring to FIG. 10b, it can be seen that it is possible to form micro circuits because the side walls are not etched.

The trace width deviation range in the conventional subtractive method is ±15 μm, whereas the trace width deviation range in the semi-additive method according to the present invention is ±5 μm. Therefore, it is possible to achieve shallow etching.

Accordingly, it is possible to achieve an improvement in line density in the package substrate manufactured without using any plating lead line and the manufacturing method thereof in accordance with the present invention.

Figure 11A:
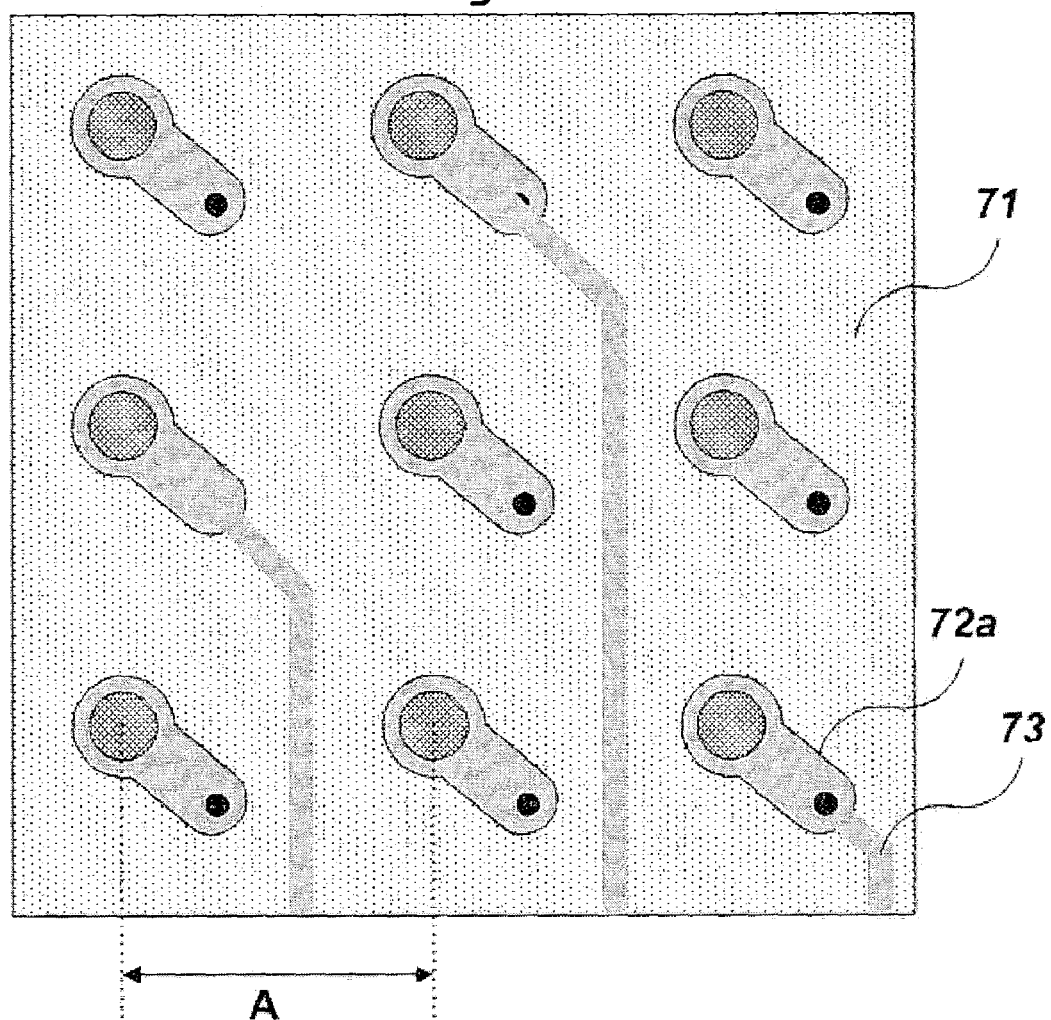
FIGS. 11a and 11b are views illustrating respective line densities of the conventional package substrate and the package substrate according to the present invention.
Figure 11B:
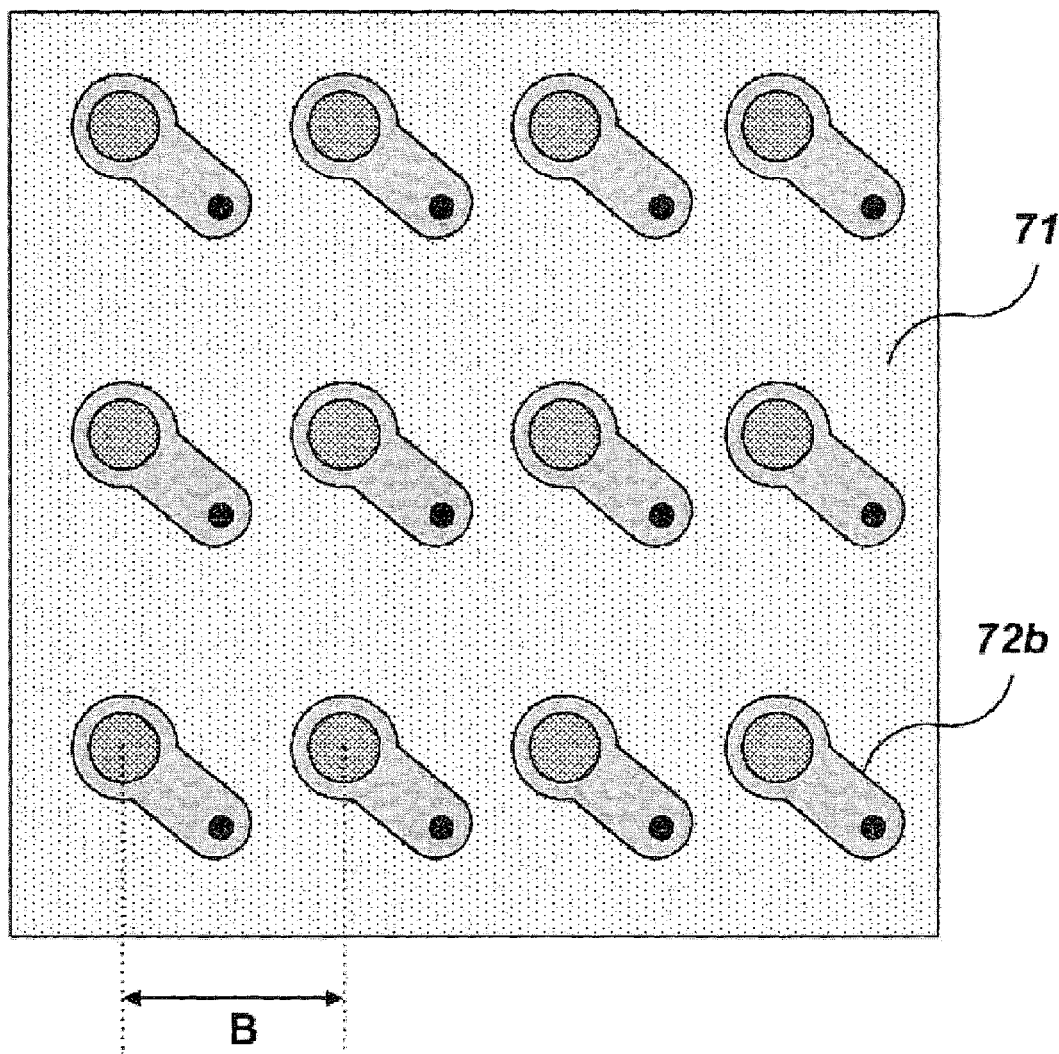

FIGS. 11a and 11b are views illustrating respective line densities of the conventional package substrate and the package substrate according to the present invention. In the conventional package substrate shown in FIG. 11a, solder ball pads 72a formed at its package substrate 71 have a ball pad pitch A defined between the centers of adjacent ones thereof. In FIG. 11a, the reference numeral 73 denotes a plating lead line. In the package substrate of the present invention shown in FIG. 11i, solder ball pads 72b formed at its package substrate 71 have a ball pad pitch B defined between the centers of adjacent ones thereof. Referring to FIGS. 11a and 11b, the ball pad pitch B is less than the ball pad pitch A by, for example, about 0.1 to 0.15 mm. That is, as compared to the conventional package substrate, the package substrate of the present invention can form an increased number of solder ball pads at the same area because it dispenses with the plating lead line 73 shown in FIG. 11a. Accordingly, an improvement in line density is achieved in accordance with the present invention.

As apparent from the above description, the present invention can improve the electrical characteristics of a package substrate such as a BGA package substrate or a CSP package substrate by carrying out an electrolytic Au plating process for the package substrate without using any plating lead line. Also, the present invention improves the design freedom of circuits by virtue of dispensing with plating lead lines. It is also possible to reduce the pitch of ball pads by about 0.1 to 0.15 mm, as compared to the ball pad pitch in conventional cases. Thus, package substrates having highly integrated circuits can be manufactured.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

In accordance with the present invention, it is possible to prevent generation of signal noise caused by residue of plating lead lines for an electrolytic Au plating process, thereby achieving an improvement in the electrical characteristics of a package substrate.

In accordance with the present invention, it is also possible to improve the design freedom (flexibility) of circuits by virtue of dispensing with plating lead lines. Accordingly, there is an advantage in manufacturing package substrates having highly integrated circuits.

What is claimed is:

1. A package substrate electrolytically plated with Au without using any plating lead line, comprising:
   a base substrate formed with a plurality of through holes;
   a first copper plated layer plated on predetermined portions of the base substrate, which serves as a plating lead line, and inner surfaces of the through holes;
   a plated pattern layer formed on the first copper plated layer, the plated pattern layer including a second copper plated layer formed on portions of the first copper plated layer;
   wire bonding pads formed on predetermined portions of the plated pattern layer to contact the second copper plated layer and contact an upper surface of the base substrate where portions of the first copper plated layer have been removed, the wire bonding pads including Au and not connected to a remnant of a plating lead line;
   solder ball pads formed on predetermined portions of the plated pattern layer at a lower surface of the base substrate where portions of the first copper plated layer have been removed, the solder ball pads including Au and not connected to a remnant of a plating lead line; and
   a solder resist having a first portion contacting the upper surface of the base substrate and the plated pattern layer and a second portion contacting the lower surface of the base substrate and the solder ball pads.

2. The package substrate according to claim 1, wherein the wire bonding pads and the solder ball pads are Au layers plated in accordance with application of current to the first copper plated layer.

3. The package substrate according to claim 1, wherein the first copper plated layer serves as a plating lead line during the electrolytic Au plating processes for the solder ball pads and the wire bonding pads.

4. The package substrate according to claim 1, wherein each of the electrolytic Au plating process forms a plated layer having a thickness of 0.5 to 1.5 μm.

5. The package substrate according to claim 1, wherein the first copper plated layer is an electroless copper plated layer.

6. The package substrate according to claim 1, wherein the base substrate is a copper clad laminate (CCL).

7. The package substrate according to claim 1, wherein the solder resist covers portions of the wire bonding pads or the solder ball pads, and exposes other portions of the wire bonding pads or the solder ball pads.

8. The package substrate according to claim 1, wherein the second copper plated layer fills the through holes.

* * * * *